US007385544B2

(12) United States Patent
Chia

(10) Patent No.: US 7,385,544 B2
(45) Date of Patent: *Jun. 10, 2008

(54) REFERENCE VOLTAGE GENERATORS FOR USE IN DISPLAY APPLICATIONS

(75) Inventor: Chor-Yin Chia, San Jose, CA (US)

(73) Assignee: Intersil Americas Inc., Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/681,127

(22) Filed: Mar. 1, 2007

(65) Prior Publication Data

US 2007/0146187 A1 Jun. 28, 2007

Related U.S. Application Data

(62) Division of application No. 11/207,480, filed on Aug. 19, 2005, now Pat. No. 7,193,551.

(60) Provisional application No. 60/656,690, filed on Feb. 25, 2005.

(51) Int. Cl.
*H03M 1/66* (2006.01)

(52) U.S. Cl. ...................... 341/144; 341/122; 341/141; 341/145; 345/87; 345/89; 345/98; 345/99; 345/100

(58) Field of Classification Search ................ 341/122, 341/144-145; 345/98, 99, 100
See application file for complete search history.

(56) References Cited

U.S. PATENT DOCUMENTS 5,170,158 A * 12/1992 Shinya ........................ 345/98
5,510,748 A * 4/1996 Erhart et al. ................ 327/530
5,844,532 A 12/1998 Silverbrook et al.
6,097,362 A * 8/2000 Kim ............................ 345/87
6,100,879 A * 8/2000 Da Costa .................... 345/211

(Continued)

OTHER PUBLICATIONS

"Analog Devices: 10-Channel Gamma Buffer with Vcom Driver,"ADD8710, Analog Devices, Inc.(2004), http://www.analog.com/UploadedFiles/Data_Sheets/136071332ADD8710_a.pdf.

(Continued)

*Primary Examiner*—Khai M Nguyen
(74) *Attorney, Agent, or Firm*—Fliesler Meyer LLP

(57) ABSTRACT

A multi-reference voltage generator includes an interface controller, a first bank of N m-bit registers and a second bank of N m-bit registers. A first multiplexer has inputs connected to outputs of the first and second bank of registers. An m-bit digital-to-analog (DAC) has an m-bit parallel input connected to an output of the first multiplexer. An analog demultiplexer has an input connected to an analog output of the m-bit DAC. Each sample-and-hold circuit in a first group of N sample-and-hold (S/H) circuits is connected to a corresponding output of the analog demultiplexer. Similarly, each S/H circuit in a second group of N S/H circuits is connected to a corresponding output of the analog demultiplexer. N further multiplexers each have a first input connected to an output of a corresponding one of the S/H circuits in the first group and a second input connected to an output of a corresponding one of the S/H circuits in the second group. N output buffers, each have an input connected to an output of a corresponding one of the N further multiplexers, and an output useful for driving a column driver.

18 Claims, 6 Drawing Sheets

U.S. PATENT DOCUMENTS

| | | | | |
|---|---|---|---|---|
| 6,154,121 | A | 11/2000 | Caims et al. | |
| 6,256,005 | B1 * | 7/2001 | Kim | 345/88 |
| 6,353,224 | B1 | 3/2002 | Sinclair et al. | |
| 6,437,716 | B2 | 8/2002 | Nakao | |
| 6,593,934 | B1 | 7/2003 | Liaw et al. | |
| 6,781,532 | B2 | 8/2004 | Wei | |
| 6,801,178 | B2 | 10/2004 | Nitta et al. | |
| 6,836,232 | B2 | 12/2004 | Bu | |
| 6,879,310 | B2 | 4/2005 | Nose | |
| 6,897,800 | B2 | 5/2005 | Chia | |
| 6,950,045 | B2 | 9/2005 | Kim | |
| 6,961,015 | B2 | 11/2005 | Kernahan et al. | |
| 7,180,497 | B2 * | 2/2007 | Lee et al. | 345/98 |
| 7,180,499 | B2 * | 2/2007 | Lee et al. | 345/100 |
| 7,196,685 | B2 * | 3/2007 | Lee et al. | 345/99 |
| 2003/0085865 | A1 * | 5/2003 | Lee et al. | 345/98 |
| 2004/0125067 | A1 * | 7/2004 | Kim et al. | 345/98 |
| 2004/0125422 | A1 * | 7/2004 | Wang et al. | 358/519 |
| 2004/0263540 | A1 | 12/2004 | Ooishi et al. | |

OTHER PUBLICATIONS

"Temperature Compensating Gamma Trimster ATT3209," Alta Analog, Inc. (2004), http://www.alta-analog.com/Speciications/ATT3209.pdf.

"Gamma Trimster AGT1809," Alta Analog, Inc. (2004), http://www.alta-analog.com/Speciications/AGT1809.pdf.

Harrison, et al., "A CMOS Programmable Analog Memory Cell Array Using Floating-Gate Circuits," IEEE Transactions on Circuits and Systems, vol. 48(1); pp. 4-11, (Feb. 2001), http://www.ece.utah.edu/~harrison/papers/TCASII2001.pdf.

* cited by examiner

REFERENCE VOLTAGE GENERATORS FOR USE IN DISPLAY APPLICATIONS

PRIORITY CLAIM

This application is a divisional of U.S. patent application Ser. No. 11/207,480, filed Aug. 19, 2005 (now allowed), which claims priority under 35 U.S.C. 119(e) to U.S. Provisional Patent Application No. 60/656,690, filed Feb. 25, 2005. Each of these applications are incorporated herein by reference.

FIELD OF THE INVENTION

Embodiments of the present invention relate to the field of integrated circuits, and more specifically to reference voltage generators that are useful in display (e.g., LCD) applications.

BACKGROUND

In conventional flat panel display systems, such as liquid crystal display (LCD) systems, the brightness of each pixel or element is controlled by a transistor. An active matrix display includes a grid of transistors (e.g., thin film transistors) arranged in rows and columns. A column line is coupled to a drain or a source associated with each transistor in each column. A row line is coupled to each gate associated with the transistors in each row. A row of transistors is activated by providing a gate control signal to the row line which turns on each transistor in the row. Each activated transistor in the row then receives an analog voltage value from its column line to cause it to emit a particular amount of light. Generally speaking, a column driver circuit provides the analog voltage to the column lines so that the appropriate amount of light is emitted by each pixel or element. The resolution of a display is related to the number of distinct brightness levels. For a high quality display, a multi-reference voltage generator (e.g., eight or more voltages) is needed to supply voltages to the column driver.

FIG. 1 shows an LCD display 102 along with portions of its driver circuitry, including column driver(s) 104, and a multi-reference voltage generator 106, which provides analog voltages to the column driver(s) 104. Although FIG. 1 shows the driver circuitry logically separate from the display 102, commercial displays may combine the display and the driver circuitry into a single thin package. Therefore, a major consideration in developing circuitry for such displays is the microchip die size required to implement the driver circuitry. Cost is also a factor to be taken into account.

To achieve multi-reference voltage outputs, digital-to-analog converters (DACs) can be used to generate different voltages. Capacitors can be coupled to the DACs to temporarily buffer the voltages. Such a multi-reference voltage circuit has been conventionally implemented in several ways. One way uses a multi-DAC structure as shown in FIG. 2, discussed below, wherein a separate DAC is used to drive a buffer for each of the N output channels. DAC circuits are very large, however. Accordingly, with such a multi-DAC structure, as the number of output channels increase, the chip die size will become undesirably large. What is needed is a multi-reference voltage buffer small enough to be used in flat panel display packages.

In TFT-LCD applications, column drivers drive storage capacitors in TFT-LCD cells. In large panel applications, such as in television and other monitor applications, the color accuracy of the LCD display becomes more important, as it is easily perceived by the human eye. Any mismatch between the capacitor cell voltages in the LCD cell could cause these color mismatches. The multi-reference voltage generator 106 is used to improve the accuracy and reduce the mismatch of the DACs in the column driver(s) 104. Such a multi-reference voltage generator (also known as a "reference voltage generator", a "reference voltage buffer" or a "gamma buffer") provides low impedance taps in a resistor string of the column drivers 104, and thus make them match better across the display. In addition to matching the LCD column drivers, the reference voltage generator 106 is used to implement gamma correction to improve the contrast of the LCD display, as will now be described.

The data from a video card is usually linear. However, a monitor's output luminance versus input data is nonlinear. Rather, the input data versus output luminance is roughly a 2.2 power function (where L=V^2.2, where L=luminance and V=input data voltage). Accordingly, to display a "correct" luminance, the output should be gamma corrected. This can be accomplished, e.g., by applying the following function to the input data: L'=L^(1/2.5). In addition to correcting the gamma of the LCD display, gamma correction can also stretch the gamma curve to improve the contrast of the display.

Conventionally, LCD monitors have a fixed gamma response. However, LCD manufacturers are beginning to implement dynamic gamma control, where the gamma curve is being updated on a frame-by-frame basis in an attempt to optimize the contrast on a frame-by-frame basis. This is typically accomplished by evaluating the data to be displayed, on a frame-by-frame basis, and automatically adjusting the gamma curve to provide vivid and rich colors.

FIG. 2 shows details of a conventional reference voltage generator 206, which includes an interface control 208, a pair of register banks 210 and 212, multiple (i.e., N) m-bit DACs 220 and multiple (i.e., N) buffers 230.

The interface control 208 may implement an Inter-Integrated Circuit (12C) bus interface, which is a 2-wire serial interface standard that physically consists of two active wires and a ground connection. The active wires, Serial DAta (SDA) and Serial CLock (SCL), are both bi-directional. The key advantage of this interface is that only two lines (clock and data) are required for full duplexed communication between multiple devices. The interface typically runs at a fairly low speed (100 kHz to 400 kHz), with each integrated circuit on the bus having a unique address.

The interface control 208 receives serial data addressed to the reference voltage generator 206, converts each serial m-bits of display-data into parallel data, and transfers the parallel data bits to the first bank of registers 210. The first bank of registers 210 and the second bank of registers 212 are connected in series, such that once the first bank 210 is full, the data in the first bank 210 can be simultaneously transferred to the second bank 212. Each bank of registers 210 includes, e.g., N separate m-bit registers, where N is the number of multi-level voltage outputs (OUT1-OUTN) produced by the multi-reference voltage generator 206, and m is the number of inputs in each DAC 220.

The two register banks 210 and 212 perform double-buffering to compensate for the slow I2C interface. More specifically, while the data in the N m-bit registers in bank 212 are being converted to analog voltages by the N m-bit DACs, the N m-bit registers in bank 210 are being updated. A problem with this architecture is that for every output, an m-bit DAC 220 is required, thereby impacting the size of the die. If used for dynamic gamma control, each DAC 220 needs time to settle when it is switching between two gamma curves. In most recent applications, dynamic gamma control needs to be switched at line rates and at fast settling times of 500 ns (where the period is approximately 14-20 μs). To handle such switching rates using the architecture in FIG. 2 would require relatively large transistors (which have a relative high cost) and high currents, thereby making it unrealistic for LCD applications where cost and size are of high importance. Additionally, for a same digital code, the output voltages may have large offsets due to mismatches among the multiple DACs 220 and output buffers 230.

Accordingly, it would be beneficial to provide a reference voltage generator that includes less DACs, to thereby reduce the overall die size and cost. It would also be beneficial if such a reference voltage generator can be switched at such a rate that it can be used for dynamic gamma control at line rates. Additionally, it would be beneficial to minimize mismatches that occur within a reference voltage generator.

SUMMARY

In accordance with an embodiment of the present invention, a multi-reference voltage generator includes an interface controller, a first bank of N m-bit registers (Bank A) and a second bank of N m-bit registers (Bank B). A first multiplexer has inputs connected to outputs of the first and second bank of registers. A single m-bit digital-to-analog (DAC) has an m-bit parallel input connected to an output of the first multiplexer. An analog demultiplexer has an input connected to an analog output of the m-bit DAC. Each sample-and-hold circuit in a first group of N sample-and-hold (S/H) circuits is connected to a corresponding output of the analog demultiplexer. Similarly, each S/H circuit in a second group of N S/H circuits is connected to a corresponding output of the analog demultiplexer. N further multiplexers each have a first input connected to an output of a corresponding one of the S/H circuits in the first group and a second input connected to an output of a corresponding one of the S/H circuits in the second group. N output buffers, each have an input connected to an output of a corresponding one of the N further multiplexers, and an output useful for driving a column driver.

In accordance with an embodiment of the present invention, the second bank of registers is written to while data in the first bank of registers is converted to analog voltages and stored in the first group of S/H circuits. Similarly, the first bank of registers is written to while data in the second bank of registers is converted to analog voltages and stored in the second group of S/H circuits.

Based on a select signal provided to the N further multiplexers, the N further multiplexers either provide analog voltages stored in the first group of S/H circuits, or analog voltages stored in the second group of S/H circuits, to the N output buffers, in accordance with an embodiment.

In an embodiment, control data received by the interface controller specifies whether data proceeding the control data is to be written to the first bank of registers or the second bank of registers.

In accordance with an alternative embodiment, rather than using a single m-bit DAC, a pair of m-bit DACs are used, with a first one of the DACs converting digital data stored in the first bank to analog voltages, and the second one of the DACs converting digital data stored in the second bank to analog voltages.

Further embodiments, and the features, aspects, and advantages of the present invention will become more apparent from the detailed description set forth below, the drawings and the claims.

DETAILED DESCRIPTION

Figure 1:
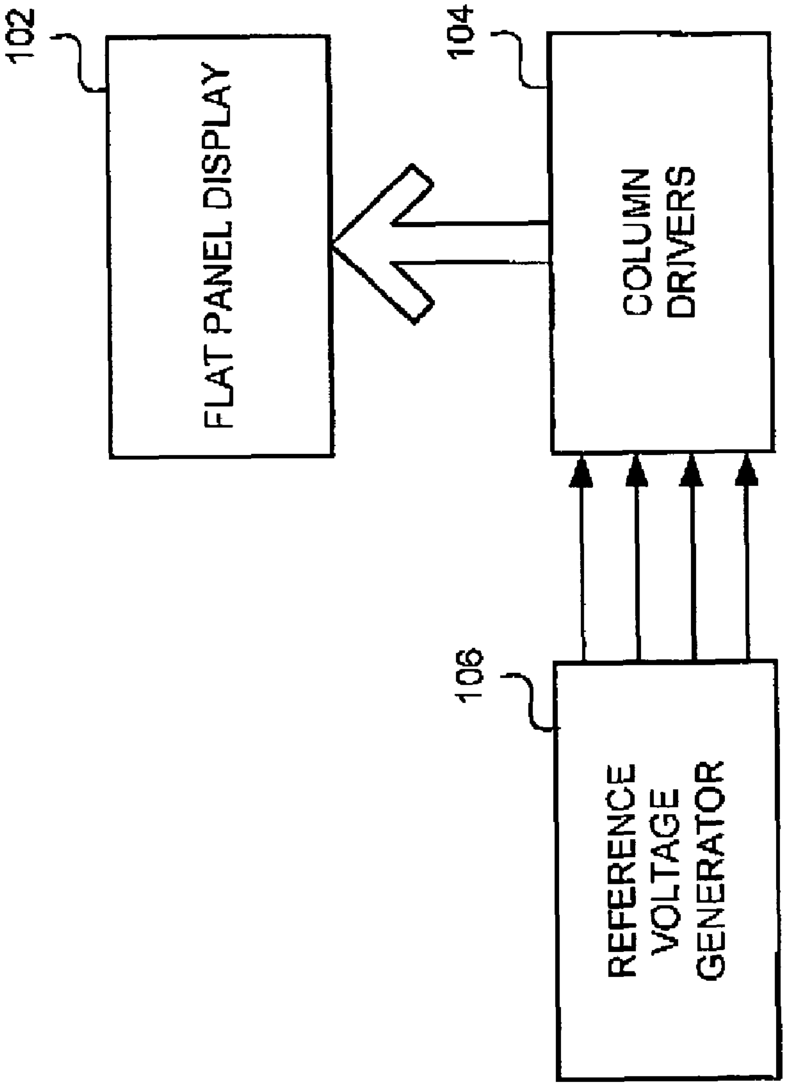
FIG. 1 (PRIOR ART)
FIG. 1 is a high level block diagram showing an LCD display along with portions of its driver circuitry.
Figure 2:
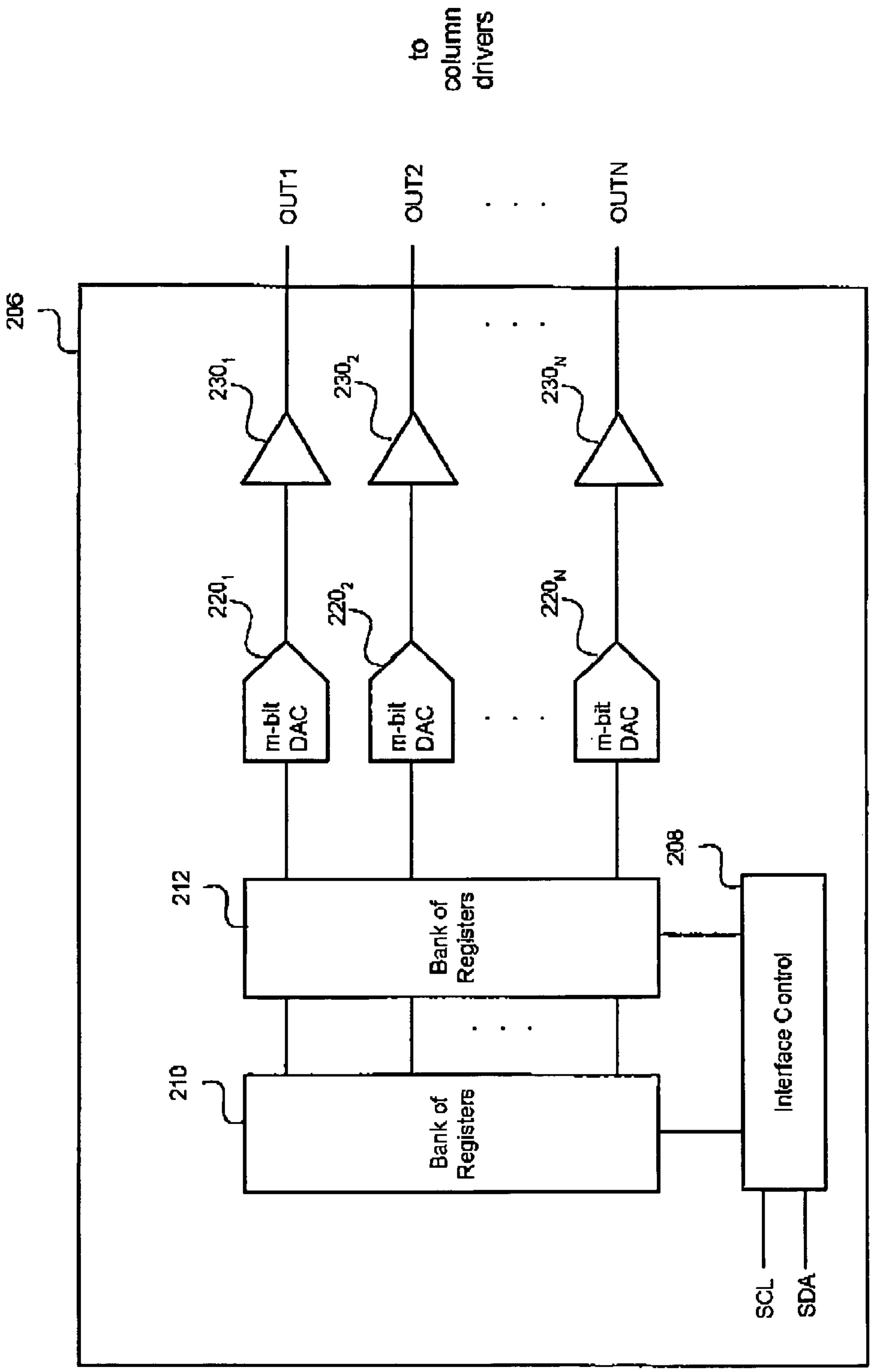
FIG. 2 (PRIOR ART)
FIG. 2 is a high level block diagram showing details of a conventional reference voltage generator.
Figure 3A:
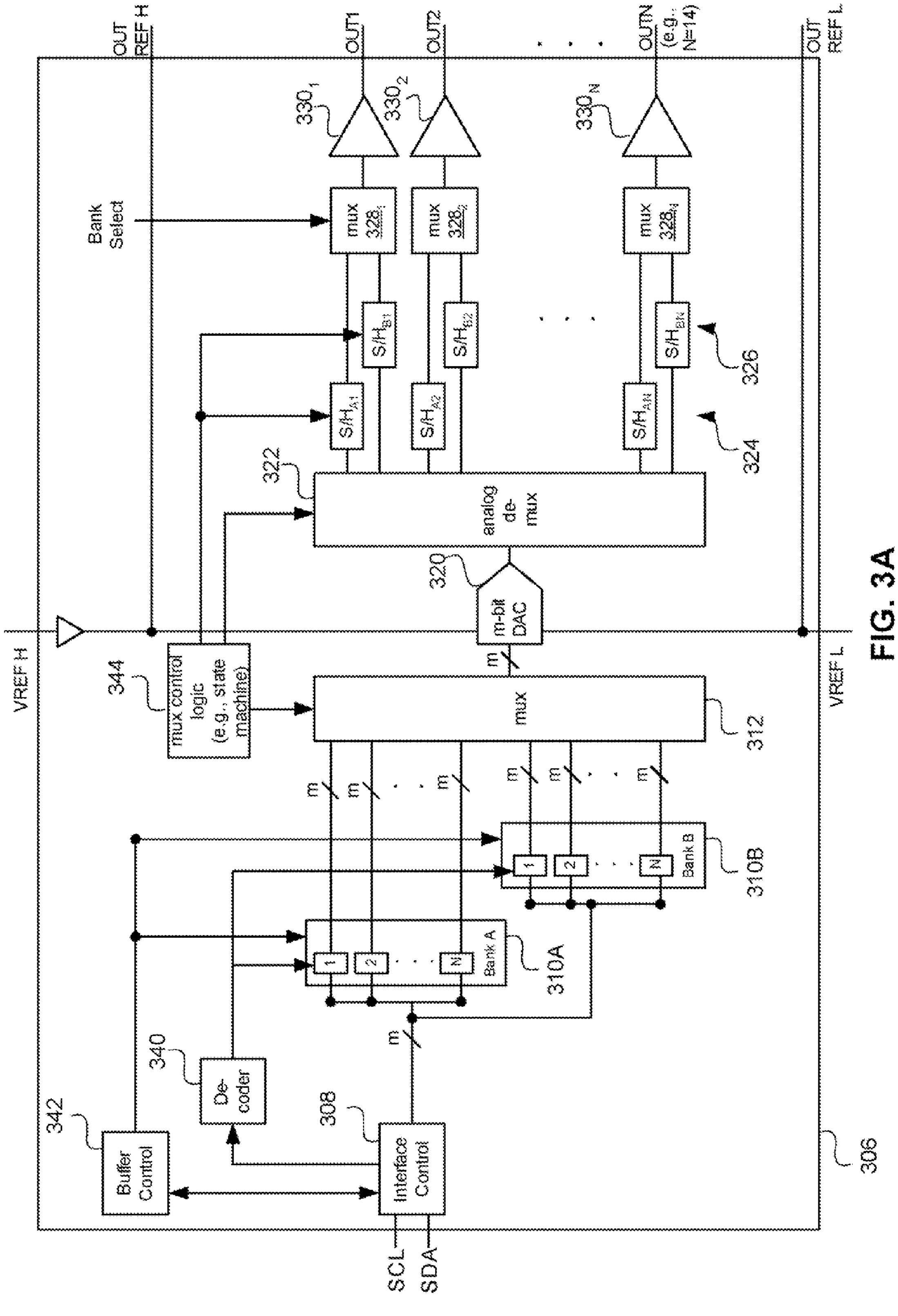
FIG. 3A is a high level block diagram of a reference voltage generator, according to an embodiment of the present invention.

FIG. 3A shows a reference voltage generator 306, according to an embodiment of the present invention. The reference voltage generator 306 is shown as including an interface control 308, which in accordance with an embodiment of the present invention implements an I2C interface, and thus receives a Serial DAta (SDA) and a Serial Clock (SCL) from a bus having two active wires. The reference voltage generator 306 is also shown as including a first bank of registers 310A (also referred to as Bank A) and a second bank of registers 310B (also referred to as Bank B), with the banks being parallel to one another, rather than being in series with one another (as was the case with banks 210 and 212 in FIG. 2).

The interface control 308 also provides an output to a decoder 340, which produces a digital output that cycles from 1 to N in a manner such that the 1st m-bit register in Bank A (or Bank B) accepts display-data 1, the 2nd m-bit register accepts display-data 2 . . . and the Nth m-bit register accepts display-data N. While the data is provided m-bits at a time to both Bank A and Bank B, only one Bank is selected at a time by the buffer control 342 to actually accept that data. As will be described in more detail below, in accordance with an embodiment of the present invention, a control bit indicates whether Bank A or Bank B is selected to store the data. While the data is provided m-bits at a time to both Bank A and Bank B, only one Bank is selected at a time by the buffer control 342 to actually accept that data.

Figure 3B:
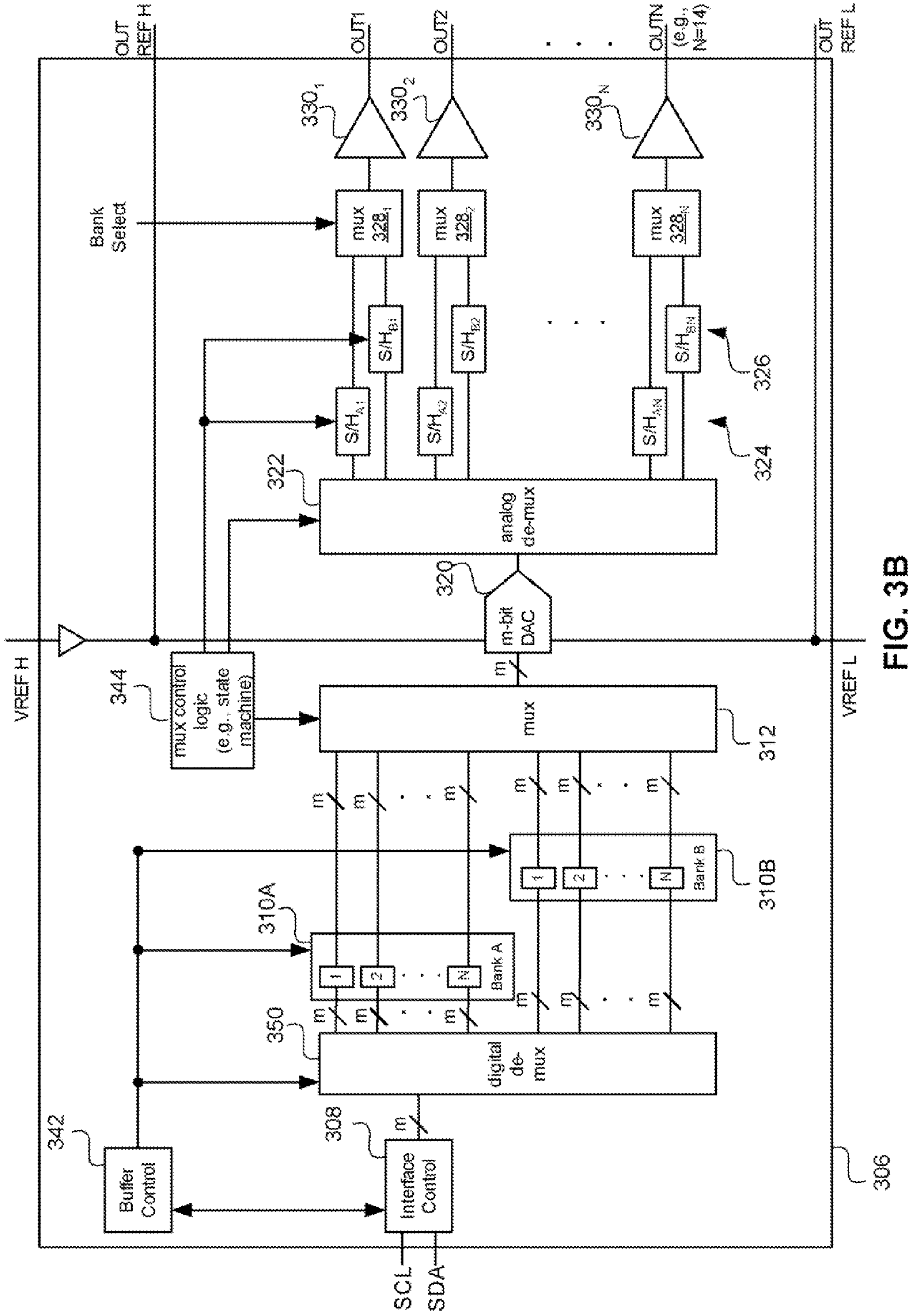
FIG. 3B is a high level block diagram of a reference voltage generator, according to another embodiment of the present invention.

Instead of having (or in addition to having) the decoder 340, a digital demultiplexer 350 can be located between the interface control 308 and the register banks 310A, 310B, as shown in FIG. 3B. This digital demultiplexer 350 would provide the 1st m-bit register in Bank A (or Bank B) with display-data 1, the 2nd m-bit register with display-data 2 . . . and the Nth m-bit register with display-data N. In accordance with an embodiment, the digital demultiplexer 350 knows which bank to provide specific data to, based on a control bit that indicates whether Bank A or Bank B should store the data. Alternatively, the digital demultiplexer 350 can provided data m-bits at a time to both Bank A and Bank B, but only one Bank is selected at a time by the buffer control 342 to actually accept that data.

The outputs of the first and second register banks 310A and 310B (i.e., Bank A and Bank B) are provided to a multiplexer (mux) 312, the output of which drives a single DAC 320 (as opposed to multiple DACs, i.e., N DACs, as was the case in FIG. 2). The output of the DAC 320 is provided to an input of an analog demultiplexer (demux) 322. The outputs of the demux 322 are provided to a first group of sample-and-holds 324 labeled $S/H_{A1}$ through $S/H_{AN}$, and a second group of sample-and-holds 326 labeled $S/H_{B1}$ through $S/H_{BN}$. As will be described below, the first group of sample-and-holds 324 ($S/H_{A1}$-$S/H_{AN}$) correspond to register Bank A (310A), and the second group of sample-and-holds 326 ($S/H_{B1}$-$S/H_{BN}$) correspond to register Bank B (310B). The outputs of $S/H_{A1}$ and $S/H_{B1}$ are provided to a mux $\mathbf{328_1}$, the outputs of $S/H_{A2}$ and $S/H_{B2}$ are provided to a mux $\mathbf{328_2}$ . . . and the outputs of $S/H_{AN}$ and $S/H_{BN}$ are provided to a mux $\mathbf{328_N}$. In this arrangement, the multiplexers $\mathbf{328_1}$ through $\mathbf{328_N}$, as instructed by a Bank Select signal, are used to provide the analog voltages stored in the first group of sample-and-holds 324, or the analog voltages stored in the second group of sample-and-holds 326, to the output buffers $\mathbf{330_1}$-$\mathbf{330_N}$, the outputs of which are provided to one or more column drivers (not shown in FIGS. 3A or 3B).

Mux control logic 344 (e.g., a state machine) can be used to control the multiplexer 312 and the analog demultiplexer 322. An exemplary implementation of the mux 312, control logic 344, demux 322 and the S/H circuits are described in commonly assigned U.S. Pat. No. 6,781,532, which is incorporated herein by reference. A specific exemplary implementation of the analog demultiplexer 322 is described in commonly invented and commonly assigned U.S. patent application Ser. No. 10/236,340, filed Sep. 5, 2002 (now allowed), which is incorporated herein by reference.

Figure 4:
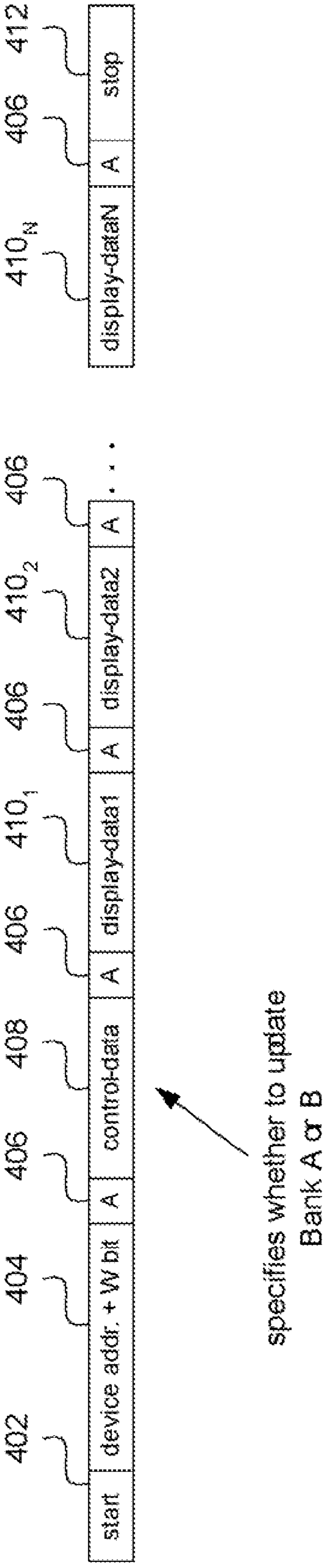
FIG. 4 is useful for illustrating a Serial DAta signal (SDA) during a write operation, according to an embodiment of the present invention.
Figure 5:
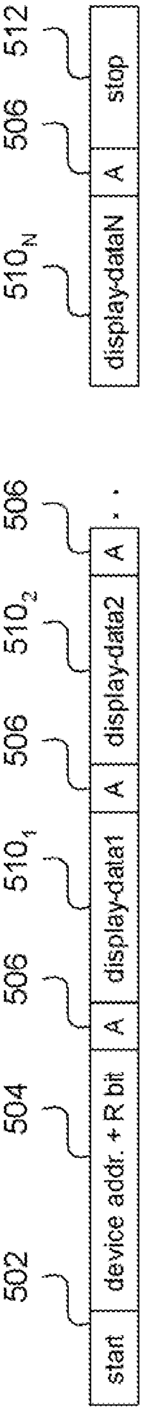
FIG. 5 is useful for illustrating a Serial DAta signal (SDA) during a read operation, according to an embodiment of the present invention.

An exemplary Serial DAta (SDA) signal received at the interface control 308 from a master device (during a write transfer) is shown in FIG. 4. An exemplary SDA output by the interface control 308 to a master device (during a read transfer) is shown in FIG. 5.

Referring to FIG. 4, the data signal is shown as including a start condition 402, a device address plus write bit 404, an acknowledge bit 406, control-data 408, an acknowledge bit 406, display-data1 $\mathbf{410_1}$ through display-dataN $\mathbf{410_N}$ (each of which is followed by an acknowledge bit 406) and a stop condition 412, according to an embodiment of the present invention. The device address can be, e.g., a 7 bit word identifying the voltage reference generator IC, followed by a read/write bit (e.g., 0=a write transmission where a master device will send data to the voltage reference generator to set or program a desired reference voltage; 1=a read transmission where a master device will receive data from the voltage reference generator to read the previous data from which the voltage reference was set or programmed). An exemplary master device that can be used with embodiments of the present invention includes, but is not limited to, a simple EEPROM, or a more complicated timing controller, ASIC or FPGA.

In accordance with an embodiment of the present invention, the control-data 408 is a one byte word, where the first least significant bit (LSB) indicates whether or not there is a clock delay (e.g., 0=no clock delay; 1=delay clock 3.5 μs), the second LSB indicates whether to write to Bank A or Bank B (e.g., 0=Bank A; 1=Bank B); the third LSB indicates whether to read from Bank A or Bank B (e.g., 0=Bank A; 1=Bank B); the fourth LSB indicates whether to use the an internal or external oscillator (e.g., 0=internal; 1=external); and the four most significant bits (MSBs) are don't cares.

Referring again to FIG. 3A, in operation, the interface control 308 receives a SDA and SCL signal, e.g., from a master device. Most likely, such serial data has already been gamma corrected. During a write operation, which is used to provide N multi-level voltage signals (OUT1-OUTN) to a column driver, the control bits (of the control-data 408) are provided to a buffer control 342, which can detect from the control bits whether the incoming display-data is to be stored in the first bank 310A or the second bank 310B (i.e., in Bank A or Bank B).

Referring to FIG. 3A, the interface control 308 provides m-data bits at time in parallel to both Bank A and Bank B, but depending on which one is selected by the buffer control 342, only one of the Banks (310A or 310B) stores the N m-bits of display data in its N m-bit registers (e.g., N=14 and m=8). The decoder 340 controls which m-bit registers within the selected Bank A or Bank B accepts the display data, such that the 1st m-bit register in the selected bank accepts display-data 1, the 2nd m-bit register in the selected bank accepts display-data 2 . . . and the Nth m-bit register in the selected bank accepts display-data N. In this manner, the control-data of the incoming SDA signal is used to determine whether the incoming display-data(1 through N) will update Bank A or Bank B. This feature enables a master device to either write to Bank A while keeping Bank B constant, or to write to Bank B while keeping Bank A constant.

Alternatively, referring to FIG. 3B, the interface control 308 provides m-data bits at time in parallel to the demux 350, and the demux 350 provides the m-data bits to Bank A or Bank B, depending on which one is selected by the buffer control 342, so only one of the Banks stores the N m-bits of display data in its N m-bit registers (e.g., N=14 and m=8). The demux 350 controls which m-bit registers within the selected Bank A or Bank B accepts the display data, such that the 1st m-bit register in the selected bank accepts display-data 1, the 2nd m-bit register in the selected bank accepts display-data 2 . . . and the Nth m-bit register in the selected bank accepts display-data N. In a similar manner as described above with reference to FIG. 3A, the control-data of the incoming SDA signal is used to determine whether the incoming display-data(1 through N) will update Bank A or Bank B. Again, this feature enables a master device to either write to Bank A while keeping Bank B constant, or to write to Bank B while keeping Bank A constant.

Referring to both FIGS. 3A and 3B, the register bank that is being kept constant is used to drive the single DAC 320, while the other bank gets updated. For example, while Bank B is getting updated with new display-data, the digital data in Bank A is converted into analog voltages by the single DAC 320, which is then sampled into the sample-and-holds with subscripts A (i.e., into the first group of sample-and-holds 324); and while Bank A is getting updated with new display-data, the digital data in Bank B is converted into analog voltages by the single DAC 320, which is then sampled into the sample-and-holds with subscripts B (i.e., into the second group of sample-and-holds 326).

More specifically, the mux 312 selects m-bits at a time to be provided to the m-inputs of the m-bit DAC 320. One of 2^m different analog outputs is produced at the output of the m-bit DAC 320 (depending on the m-inputs) and provided through the demux 322 to one of the sample-and-holds. At any give time, the muxs $\mathbf{328_1}$-$\mathbf{328_N}$, which are controlled by a Bank Select signal, determine whether the analog voltages from the first group of sample-and-holds 324 (i.e., $S/H_{A1}$-$S/H_{AN}$) or the second group of sample-and-holds 326 (i.e., $S/H_{B1}$-$S/H_{BN}$) are provided to the output buffers $\mathbf{330_1}$-$\mathbf{330_N}$ (which depending on implementation, may or may not provide amplification), and thereby used to drive the column driver(s). While the first group of sample-and-holds 324 (i.e., S/$H_{A1}$-S/$H_{AN}$) are being updated, the muxs 328$_1$-328$_N$ cause the analog voltages in the second group of sample holds 326 (i.e., S/$H_{B1}$-S/$H_{BN}$) to be provided to the output buffers 330$_1$-330$_N$, and vise versa.

Advantages of the multi-reference voltage generators 306 of the present invention, described with reference to FIGS. 3A and 3B, is that instead of using one DAC per output (i.e., N separate DACs for N outputs), a single DAC 320 and multiple sample-and-holds are used, thereby saving die cost and reducing die size. Also, by using a single DAC 320, for a specific digital display-data input, the DAC 320 will not cause any mismatch (however, some mismatches may still occur if the output buffers 330 are not matched). Additionally, the settling time to switch between Bank A and Bank B is only limited by the settling time of the output buffers 330, since an analog voltage is always readily available through the groups of sample-and-holds 324 or 326.

Figure 6:
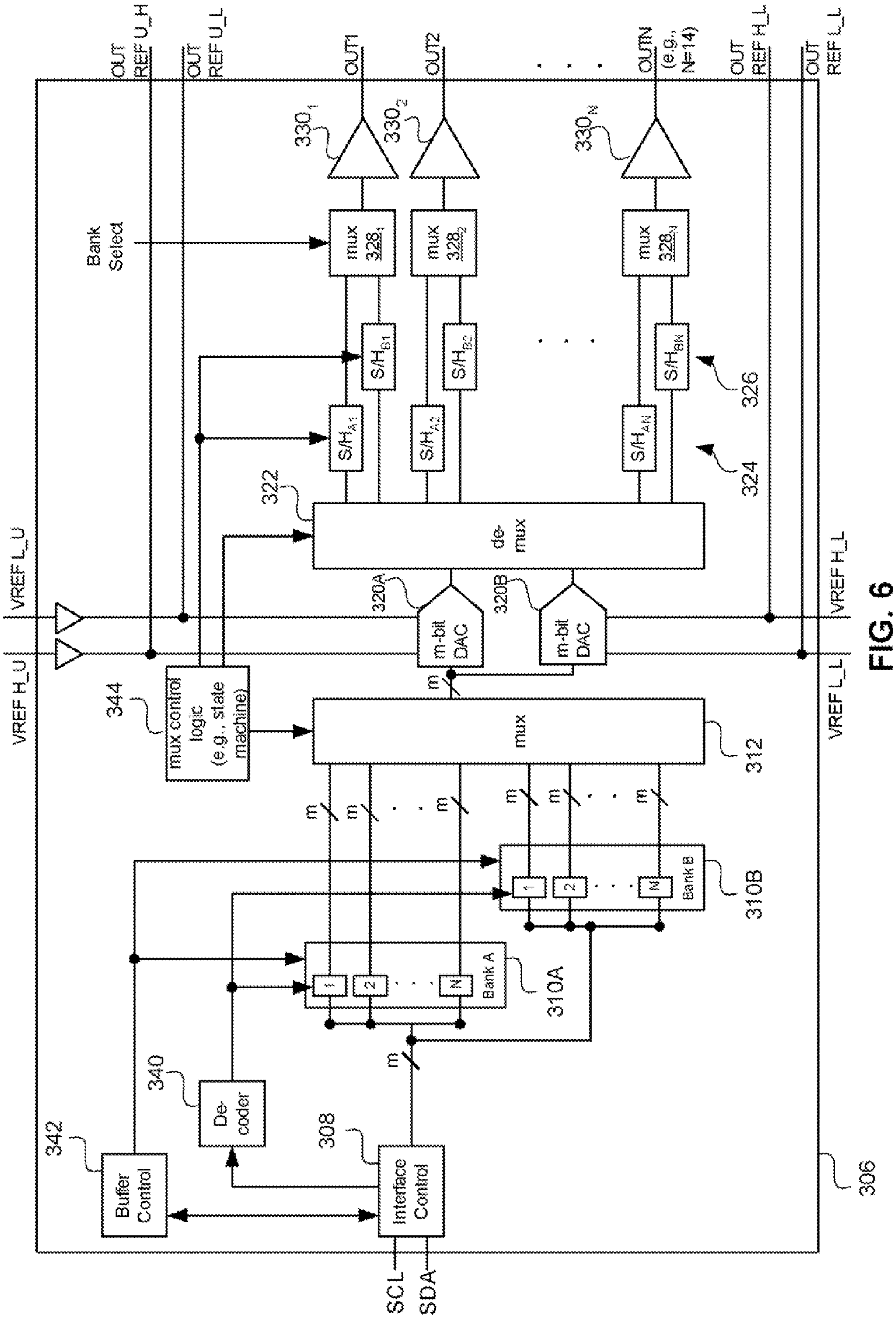
FIG. 6 is a high level block diagram of a reference voltage generator, according to a further embodiment of the present invention.

In another embodiment, shown in FIG. 6, rather than using a single DAC 320, a pair of DACs 320A and 320B are used, one being associated with Bank A and the other being associated with Bank B. While two DACs cost more and take up more die space than a single DAC, two DACs are less costly and take up less die space than N DACs, where N is greater than 2 (e.g., N may equal 14).

In one embodiment, the display-data written into the first register bank 310A (i.e., Bank A) corresponds to a first gamma curve, and the display-data written into the second register bank 310B (i.e., Bank B) corresponds to a second gamma curve, thereby enabling fast switching between two different gamma curves, e.g., on a frame-by-frame basis. Embodiments of the present invention are also useful in an environment where more than one pixel (e.g., a pair of pixels) is used to display each word of display-data (i.e., where the same display data, gamma corrected in more than one manner, is used to drive more than one pixel). In such an environment, each pixel may have a different gamma associated with it, or each pixel may have a dynamic gamma associated with it that is updated on a line basis.

In accordance with an embodiment of the present invention, half of the N voltage outputs (e.g., OUT1-OUTN/2) have a positive voltage polarity, and the other half (e.g., OUTN/2+1-OUTN) have a negative polarity. For example, if there are 14 voltage outputs (i.e., if N=14), then OUT1-OUT7 have a positive polarity, and OUT8-OUT14 have a negative polarity. The column driver(s) being driven by the reference voltage generator 302 receive positive voltage output OUT1-OUT7 during one frame, and then negative voltage outputs OUT8-OUT14 during a next frame, and so on, so that pixel voltages are reversed in polarity every frame so that the capacitor(s) associated with each pixel is not damaged. In such an embodiment, the reference voltage generator 302 will also output a middle voltage, known as VCOM. In each bank of registers 310A and 310B, half of the 14 registers (where N=14) will store positive display data, and the other half will store negative data that is the inverse of what is stored in the first half. This will cause the analog voltages OUT1 to OUT7 be the completely symmetrical with OUT8 to OUT14 around the VCOM voltage. The terms positive and negative, as used herein, are relative to VCOM. That is, if a voltage is greater than VCOM it is considered positive relative to VCOM, if a voltage is less than VCOM it is considered negative relative to VCOM.

In accordance with another embodiment, in order to reduce the number of registers in each bank 310A and 310B in half, only positive (or negative) display data is stored in the banks 310A and 310B, and appropriate digital inversion of the display data takes place between banks 310A, 310B and the DAC 320 (on either side of mux 312). In other words, since the analog voltages are completely symmetrical around VCOM, the digital data in half of the registers (e.g., the top half of the data registers) can be converted to digital data that would have been stored by the other half of the registers (e.g., the bottom half of the data registers) by just using a simple arithmetic function of 2's complement.

An example of this phenomena (assuming an 8-bit DAC) is shown in Table 1, shown below.

TABLE 1

| | Analog Voltage Required | Digital Data | DAC output |
|---|---|---|---|
| VrefH_U | 14.16 | | |
| OUT1 | 13.89 | 1 1 1 1 0 1 0 1 | 13.8953125 |
| OUT2 | 13.47 | 1 1 1 0 0 0 1 1 | 13.4621875 |
| OUT3 | 11.45 | 1 0 0 0 1 1 1 1 | 11.4409375 |
| OUT4 | 11.16 | 1 0 0 0 0 0 1 1 | 11.1521875 |
| OUT5 | 10.78 | 0 1 1 1 0 0 1 1 | 10.7671875 |
| OUT6 | 10.5 | 0 1 1 0 1 0 0 0 | 10.5025 |
| OUT7 | 9.86 | 0 1 0 0 1 1 0 1 | 9.8528125 |
| VrefL_U | 8 | | |
| VCOM | 7.64 | | |
| VrefH_L | 7.28 | | |
| OUT8 | 5.42 | 1 0 1 1 0 0 1 1 | 5.4271875 |
| OUT9 | 4.78 | 1 0 0 1 1 0 0 0 | 4.7775 |
| OUT10 | 4.5 | 1 0 0 0 1 1 0 1 | 4.5128125 |
| OUT11 | 4.12 | 0 1 1 1 1 1 0 1 | 4.1278125 |
| OUT12 | 3.83 | 0 1 1 1 0 0 0 1 | 3.8390625 |
| OUT13 | 1.81 | 0 0 0 1 1 1 0 1 | 1.8178125 |
| OUT14 | 1.39 | 0 0 0 0 1 0 1 1 | 1.3846875 |
| VrefL_L | 1.12 | | |

As can be seen above, the digital data of OUT14 is the 2's complement of OUT1, OUT13 is the 2's complement of OUT2, and so on. Although not specifically shown in FIGS. 3A and 3B, the functional block that would perform the above described functions (that allow for halving of the number of registers in each register bank) would be located between the banks 310A, 310B and the mux 312, or between the mux 312 and the DAC 320, in accordance with specific embodiments of the present invention.

As mentioned above, in the embodiment of FIG. 6 a pair of DACs 320A and 320B can be used (which is still less than N DACs, when N is, e.g., 14 as in this example), each associated with one of the banks 310A and 310B. Each DAC has its own reference voltages. For example, the top DAC 320A references are VrefH_U=14.16 and VrefL_U=8V, and the bottom DAC 320B references are VrefH_L=7.28 and VrefL_L=1.12 respectively.

In accordance with an embodiment of the present invention, the top DAC output implements the function (VrefH_U−VrefL_U)*(Digital Data)/256+VrefL_U; and the bottom DAC output implements the function (VrefH_L−VrefL_L)*(Digital Data)/256+VrefL_L. The pair of DACs 320A and 320B can also be used with the embodiment of FIG. 3B.

An alternate way of implement this function is to swap the voltage references in the bottom DAC 320B, such that VrefH_L=1.12 and VrefL_L=7.28. By doing so, the digital data does not need to be arithmetically changed. Table 2 below shows such a thing.

TABLE 2

| | Analog Voltage Required | Digital Data | DAC output |
|---|---|---|---|
| VrefH_U | 14.16 | | |
| OUT1 | 13.89 | 1 1 1 1 0 1 0 1 | 13.8953125 |
| OUT2 | 13.47 | 1 1 1 0 0 0 1 1 | 13.4621875 |
| OUT3 | 11.45 | 1 0 0 0 1 1 1 1 | 11.4409375 |
| OUT4 | 11.16 | 1 0 0 0 0 0 1 1 | 11.1521875 |
| OUT5 | 10.78 | 0 1 1 1 0 0 1 1 | 10.7671875 |
| OUT6 | 10.5 | 0 1 1 0 1 0 0 0 | 10.5025 |
| OUT7 | 9.86 | 0 1 0 0 1 1 0 1 | 9.8528125 |
| VrefL_U | 8 | | |
| VCOM | 7.64 | | |
| VrefH_L | 1.12 | | |
| OUT8 | 5.42 | 0 1 0 0 1 1 0 1 | 5.4271875 |
| OUT9 | 4.78 | 0 1 1 0 1 0 0 0 | 4.7775 |
| OUT10 | 4.5 | 0 1 1 1 0 0 1 1 | 4.5128125 |
| OUT11 | 4.12 | 1 0 0 0 0 0 1 1 | 4.1278125 |
| OUT12 | 3.83 | 1 0 0 0 1 1 1 1 | 3.8390625 |
| OUT13 | 1.81 | 1 1 1 0 0 0 1 1 | 1.8178125 |
| OUT14 | 1.39 | 1 1 1 1 0 1 0 1 | 1.3846875 |
| VrefL_L | 7.28 | | |

The foregoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A multi-reference voltage generator, comprising:

an interface controller having a serial data input and a parallel data output;

a first bank of N m-bit registers, said first bank of registers having a parallel data input connected to said parallel data output of said interface controller, where N is an integer ≧2, and m is integer ≧2;

a second bank of N m-bit registers, said second bank of registers also having a parallel data input connected to said parallel data output of said interface controller;

a first multiplexer having inputs connected to outputs of said first bank of registers and outputs of said second bank of registers;

an m-bit digital-to-analog (DAC) having an m-bit parallel input connected to an output of said first multiplexer;

an analog demultiplexer having an input connected to an analog output of said-bit DAC;

a first group of N sample-and-hold (S/H) circuits, wherein each S/H circuit in said first group is connected to a corresponding output of said analog demultiplexer;

a second group of N sample-and-hold (S/H) circuits, wherein each S/H circuit in said second group is connected to a corresponding output of said analog demultiplexer;

N further multiplexers, each of which has a first input connected to an output of a corresponding one of said S/H circuits in said first group and a second input connected to an output of a corresponding one of said S/H circuits in said second group; and N output buffers, each of which has an input connected to an output of a corresponding one of said N further multiplexers, and an output useful for driving a column driver;

wherein said second bank of registers is written to while data in said first bank of registers is converted to analog voltages and stored in said first group of S/H circuits.

2. The multi-reference voltage generator of claim 1, wherein said first bank of registers is written to while data in said second bank of registers is converted to analog voltages and stored in said second group of S/H circuits.

3. The multi-reference voltage generator of claim 2, wherein, based on a select signal provided to said N further multiplexers, said N further multiplexers either provide analog voltages stored in said first group of S/H circuits, or analog voltages stored in said second group of S/H circuits, to said N output buffers.

4. The multi-reference voltage generator of claim 3, where N=14 and m=8.

5. The multi-reference voltage generator of claim 1, wherein control data received by said interface controller specifies whether data proceeding said control data is to be written to said first bank of registers or said second bank of registers.

6. The multi-reference voltage generator of claim 1, wherein:

the first bank of N m-bit registers stores N digital data values corresponding to a first gamma curve; and the second bank of N m-bit registers stores N digital data values corresponding to a second gamma curve.

7. A multi-reference voltage generator, comprising:

an interface controller having a serial data input and a parallel data output;

a first bank of N m-bit registers, where N is an integer ≧2, and m is integer ≧2;

a second bank of N m-bit registers;

a digital demultiplexer that provides m-bits of data at a time, which are presented at said parallel data output of said interface controller, to one of said registers in said first bank or said second bank;

a first multiplexer having inputs connected to outputs of said first bank of registers and outputs of said second bank of registers;

an m-bit digital-to-analog converter (DAC) having an m-bit parallel input connected to an output of said first multiplexer;

an analog demultiplexer having an input connected to an analog output of said m-bit DAC;

a first group of N sample-and-hold (S/H) circuits, wherein each S/H circuit in said first group is connected to a corresponding output of said analog demultiplexer;

a second group of N sample-and-hold (S/H) circuits, wherein each S/H circuit in said second group is connected to a corresponding output of said analog demultiplexer;

N further multiplexers, each of which has a first input connected to an output of a corresponding one of said S/H circuits in said first group and a second input connected to an output of a corresponding one of said S/H circuits in said second group; and N output buffers, each of which has an input connected to an output of a corresponding one of said N further multiplexers, and an output useful for driving a column driver;

wherein said second bank of registers is written to while data in said first bank of registers is converted to analog voltages and stored in said first group of S/H circuits.

8. The multi-reference voltage generator of claim 7, wherein said first bank of registers is written to while data in said second bank of registers is converted to analog voltages and stored in said second group of S/H circuits.

9. The multi-reference voltage generator of claim 8, wherein, based on a select signal provided to said N further multiplexers, said N further multiplexers either provide analog voltages stored in said first group of S/H circuits, or analog voltages stored in said second group of S/H circuits, to said N output buffers.

10. The multi-reference voltage generator of claim 9, where N=14 and m=8.

11. The multi-reference voltage generator of claim 7, wherein control data received by said interface controller specifies whether data proceeding said control data is to be written to said first bank of registers or said second bank of registers.

12. The multi-reference voltage generator of claim 7, wherein:

the first bank of N m-bit registers stores N digital data values corresponding to a first gamma curve; and the second bank of N m-bit registers stores N digital data values corresponding to a second gamma curve.

13. A multi-reference voltage generator, comprising:

an interface controller having a serial data input and a parallel data output;

a first bank of N m-bit registers, where N is an integer ≧2, and m is integer ≧2;

a second bank of N m-bit registers;

a means for providing m-bits of data at a time, which are presented at said parallel data output of said interface controller, to one of said registers in said first bank or said second bank;

a first m-bit digital-to-analog converter (DAC) that converts digital data in a selected one of said registers of said first bank into an analog voltage;

a second m-bit digital-to-analog converter (DAC) that converts digital data in a selected one of said registers of said second bank into an analog voltage;

an analog demultiplexer having a first input connected to an analog output of said first m-bit DAC and a second input connected to an analog output of said second m-bit DAC;

a first group of N sample-and-hold (S/H) circuits, wherein each S/H circuit in said first group is connected to a corresponding output of said analog demultiplexer;

a second group of N sample-and-hold (S/H) circuits, wherein each S/H circuit in said second group is connected to a corresponding output of said analog demultiplexer;

N multiplexers, each of which has a first input connected to an output of a corresponding one of said S/H circuits in said first group and a second input connected to an output of a corresponding one of said S/H circuits in said second group; and N output buffers, each of which has an input connected to an output of a corresponding one of said N further multiplexers, and an output useful for driving a column driver;

wherein said second bank of registers is written to while data in said first bank of registers is converted to analog voltages by said first DAC and stored in said first group of S/H circuits; and wherein said first bank of registers is written to while data in said second bank of registers is converted to analog voltages by said second DAC and stored in said second group of S/H circuits;

wherein said second bank of registers is written to while data in said first bank of registers is converted to analog voltages and stored in said first group of S/H circuit.

14. The multi-reference voltage generator of claim 13, wherein said first bank of registers is written to while data in said second bank of registers is converted to analog voltages and stored in said second group of S/H circuits.

15. The multi-reference voltage generator of claim 14, wherein, based on a select signal provided to said N further multiplexers, said N further multiplexers either provide analog voltages stored in said first group of S/H circuits, or analog voltages stored in said second group of S/H circuits, to said N output buffers.

16. The multi-reference voltage generator of claim 15, where N=14 and m=8.

17. The multi-reference voltage generator of claim 13, wherein control data received by said interface controller specifies whether data proceeding said control data is to be written to said first bank of registers or said second bank of registers.

18. The multi-reference voltage generator of claim 13, wherein:

the first bank of N m-bit registers stores N digital data values corresponding to a first gamma curve; and the second bank of N m-bit registers stores N digital data values corresponding to a second gamma curve.

* * * * *